United States Patent [19]
Jokela et al.

[11] Patent Number: 6,074,179
[45] Date of Patent: Jun. 13, 2000

[54] MAGNETOSTRICTIVE PERISTALTIC PUMP

[75] Inventors: Gregory Raymond Jokela, Ojai; Stanley Alfred Black, Ventura, both of Calif.

[73] Assignee: The United States of America as represented by the Secretary of the Navy, Washington, D.C.

[21] Appl. No.: 09/307,938

[22] Filed: May 10, 1999

[51] Int. Cl.$^7$ .................................................. F04B 17/00
[52] U.S. Cl. ........................ 417/322; 417/412; 417/474
[58] Field of Search ................................ 417/322, 412, 417/474

[56] References Cited

U.S. PATENT DOCUMENTS

| | | | |
|---|---|---|---|
| 4,917,579 | 4/1990 | Torma | 417/322 |
| 5,129,789 | 7/1992 | Thorton et al. | 417/53 |
| 5,630,709 | 5/1997 | Bar-Cohen | 417/322 |

*Primary Examiner*—Charles G. Freay
*Assistant Examiner*—Cheryl J. Tyler
*Attorney, Agent, or Firm*—David Kalmbaugh

[57] ABSTRACT

A magnetotrictive peristaltic pump transfers a fluid from a supply chamber to a receiving chamber. The pump has a housing and a core section mounted within the housing. The core section is fabricated from a magnetostrictive material such as Terfenol-D, which can be made to expand directionally in the presence of a magnetic field. There is a fluid tight seal between the inner surface of the housing and the outer surface of the core section. Wrapped around the outer surface of the housing are a plurality of electrical coils. The positive terminal and the negative terminal of each coil are connected to a signal generator which generates direct current electrical signals to sequentially energize each coil. Energizing any one of the coils creates a magnetic field in the general area of the coil. In the presence of this magnetic field, the core section expands longitudinally resulting in lateral/radial shrinkage of the core section which creates a cavity in the general area of the magnetic field. The signal generator sequentially energizes the coils to move the cavity and the fluid contained therein from the supply chamber to the receiving chamber.

13 Claims, 5 Drawing Sheets

6,074,179

MAGNETOSTRICTIVE PERISTALTIC PUMP

BACKGROUND OF THE INVENTION

1. Field of the Invention

The present invention relates generally to pumps for transferring fluids. More specifically, the present invention relates to a pump which makes use of the properties of magnetostrictive materials when a magnetic field is applied to the materials to transfer a fluid from a supply chamber to a receiving chamber.

2. Description of the Prior Art

Conventional pumps relay on moving parts (bearings, pistons, valves, vanes, gears, etc.) and their power sources (electric motors, gear transmissions, etc.) to transfer fluid from a supply chamber to a high pressure chamber. These moving parts and their power sources are subject to wear and material fatigue which will generally lead to failure of the parts and disablement of the pump. The pump's moving parts also result in pump failure because of jamming or fracture of the parts. Thermal mismatch of the parts is a source of failure when a large number of parts are required for the pump. These thermally mismatched parts also cause mechanical inefficiency.

Another problem with conventional pumps is that they are difficult to miniaturize because of the complexity of the parts and their interaction. Miniature pumps are increasingly required for a wide variety of applications including controlled liquid and gas supply, thermal management, cooling systems and vacuum control devices. An example of a vacuum pump application includes planet surface sampling missions where soil, rocks and other geological materials are collected. The samples are either analyzed remotely or returned to earth, which requires a miniature pump to preserve the samples in either a vacuum or inert atmosphere.

The performance of conventional pumps also degrades with decreasing temperature because of increases in thermal mismatch of parts. Maintaining low temperature performance is becoming increasingly important because of the growing number of low temperature applications such as the planetary missions mentioned previously. In addition to sample collection, such missions use remote analysis instruments, such as mass spectrometers, that require a vacuum be formed in a sample chamber for analysis.

In addition, there are increasing applications that require pumping mechanisms that are low cost, low in mass, consume low power and operate reliably and quietly in low ambient pressure.

Thus, it is an object of the invention to provide a pump device with few moving parts to improve operating reliability, efficiency and to facilitate the miniaturization of the mechanism.

It is another object of the invention to provide a pump whose performance is maintained at low temperature and low ambient pressures.

Further, it is an object of the invention to provide a pump having a small number of components that are light weight, inexpensive and consume low amounts of power.

SUMMARY OF THE INVENTION

The present invention provides a magnetostrictive peristaltic pump for inducing a displacement of a fluid from a supply chamber to a receiving chamber. The magnetostrictive peristaltic pump comprises a housing and a core section mounted within the housing. The core section is fabricated from a magnetostrictive material such as ETREMA Terfenol-D, which can be made to expand directionally in the presence of a magnetic field. There is a fluid tight seal between the inner surface of the housing and the outer surface of the core section.

Wrapped around the outer surface of the housing are a plurality of equally spaced apart electrical coils. The positive terminal and the negative terminal of each coil are connected to a signal generator which generates direct current electrical signals to sequentially energize each coil.

Energizing any one of the coils creates a magnetic field in the general area of the coil. In the presence of this magnetic field, the core section expands longitudinally resulting in lateral/radial shrinkage of the core section which creates a cavity in the general area of the magnetic field. The signal generator sequentially energizes the coils to move the cavity and the fluid contained therein from the supply chamber to the receiving chamber.

DETAILED DESCRIPTION OF THE PREFERRED EMBODIMENT

Figure 1:
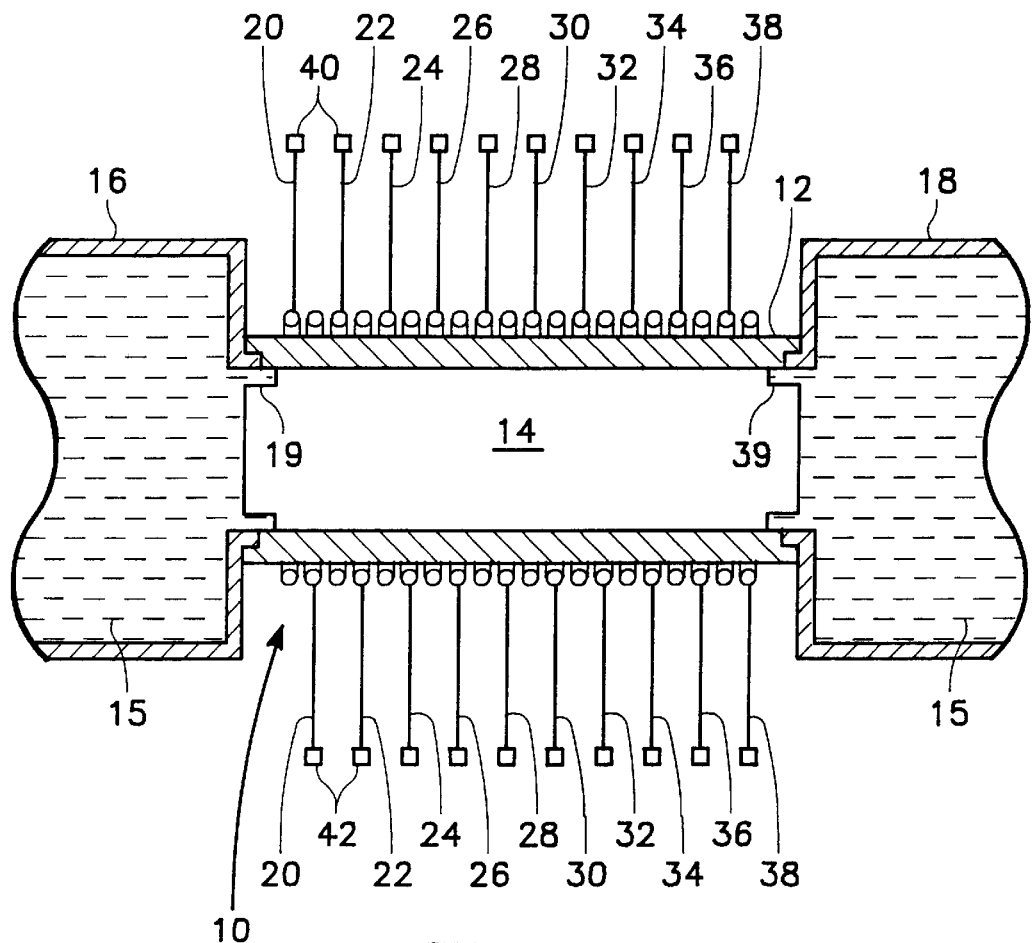
FIG. 1 is a cross sectional view of a magnetostrictive peristaltic pump which constitutes the preferred embodiment of the present invention.

Referring to FIG. 1, there is shown a magnetostrictive peristaltic pump, designated generally by the reference numeral 10 which constitutes a preferred embodiment of the present invention. Magnetostrictive peristaltic pump 10 is used to transfer a fluid 15 from a supply chamber 16 to a receiving chamber 18. The fluid transferred by pump 10 may be fresh water, sea water or any other fluid normally transferred by conventional electro-mechanical type pumps. In addition, the magnetostrictive perostaltic pump 10 may be adapted for transfer gases.

Magnetostrictive peristaltic pump 10 includes an outer housing 12 which may be fabricated from stainless steel and a inner core section/member 14 positioned/mounted within housing 12. Housing 12 may, for example, have a tubular shape which necessitates that section 14 have a cylindrical shape. Pump 10 may also having a rectangular shape resulting in box tube shaped outer housing 12 and a bar stock inner core section 14.

In the preferred embodiment of the present invention, inner core section 14 is fabricated from a magnetostrictive material such as ETREMA Terfenol-D, which can be made to expand directionally in the presence of a magnetic field. The properties of magnetostrictive materials are such that an imposition of a magnetic field upon a magnetostrictive material causes the material to change size. Magnetostriction is defined as the change of a ferromagnetic substance when it is magnetized. More generally, magnetostriction is the phenomenon that the state of strain of a ferromagnetic sample depends upon the direction and extent of magnetization.

Terfenol is a binary rare earth alloy $TbFe_2$. Terfenol-D is an alloy of the form $Tb[x]Dy[1-x]Fe_2$ where x=0.3. The material Terfenol-D is commercially available from Etrema Products Inc. of Ames, Iowa.

Figure 4:
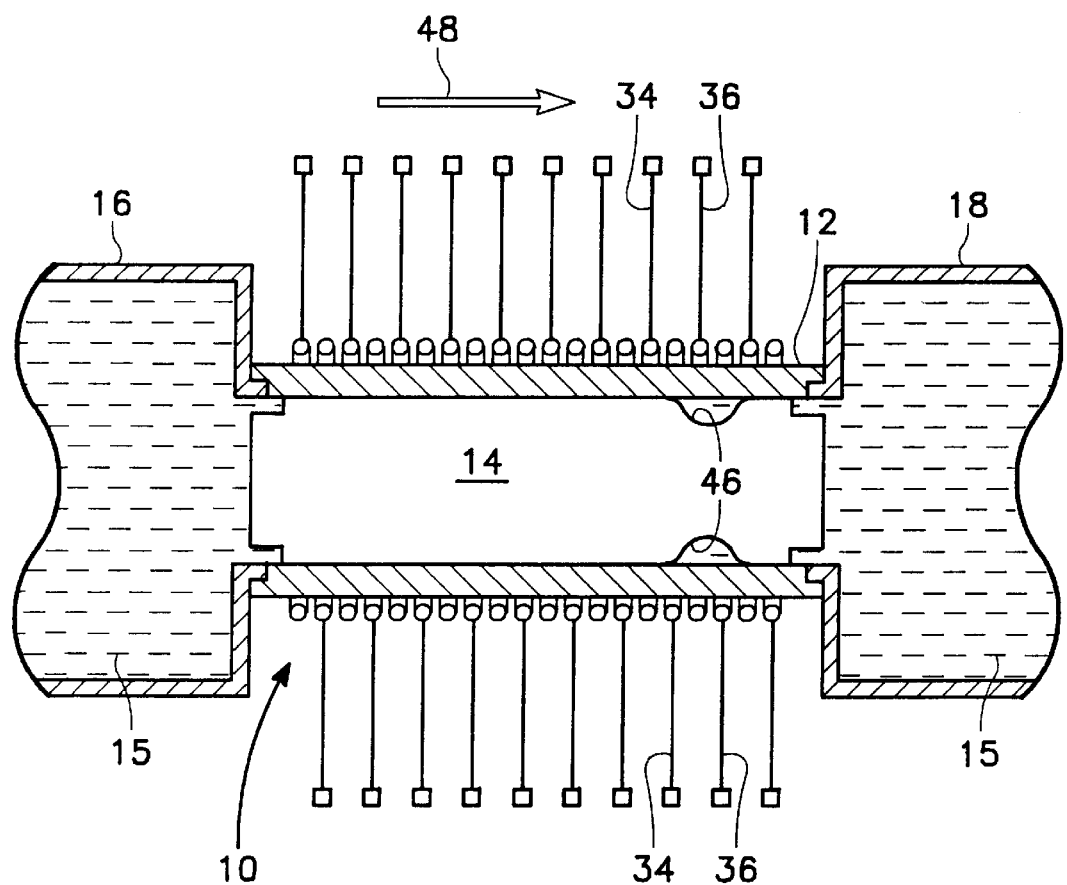

At this time it should be noted that housing 12 and section 14 have a common longitudinal axis (as indicated by arrow 48, FIG. 4). It should be noted that there is zero clearance between the inner surface of housing 12 and the outer surface of section 14 when a magnetic field is not acting upon the Terfenol-D which comprises section 14. This results in a fluid tight seal between the inner surface of housing 12 and the outer surface of section 14 which prevents fluid leakage.

Figure 2:
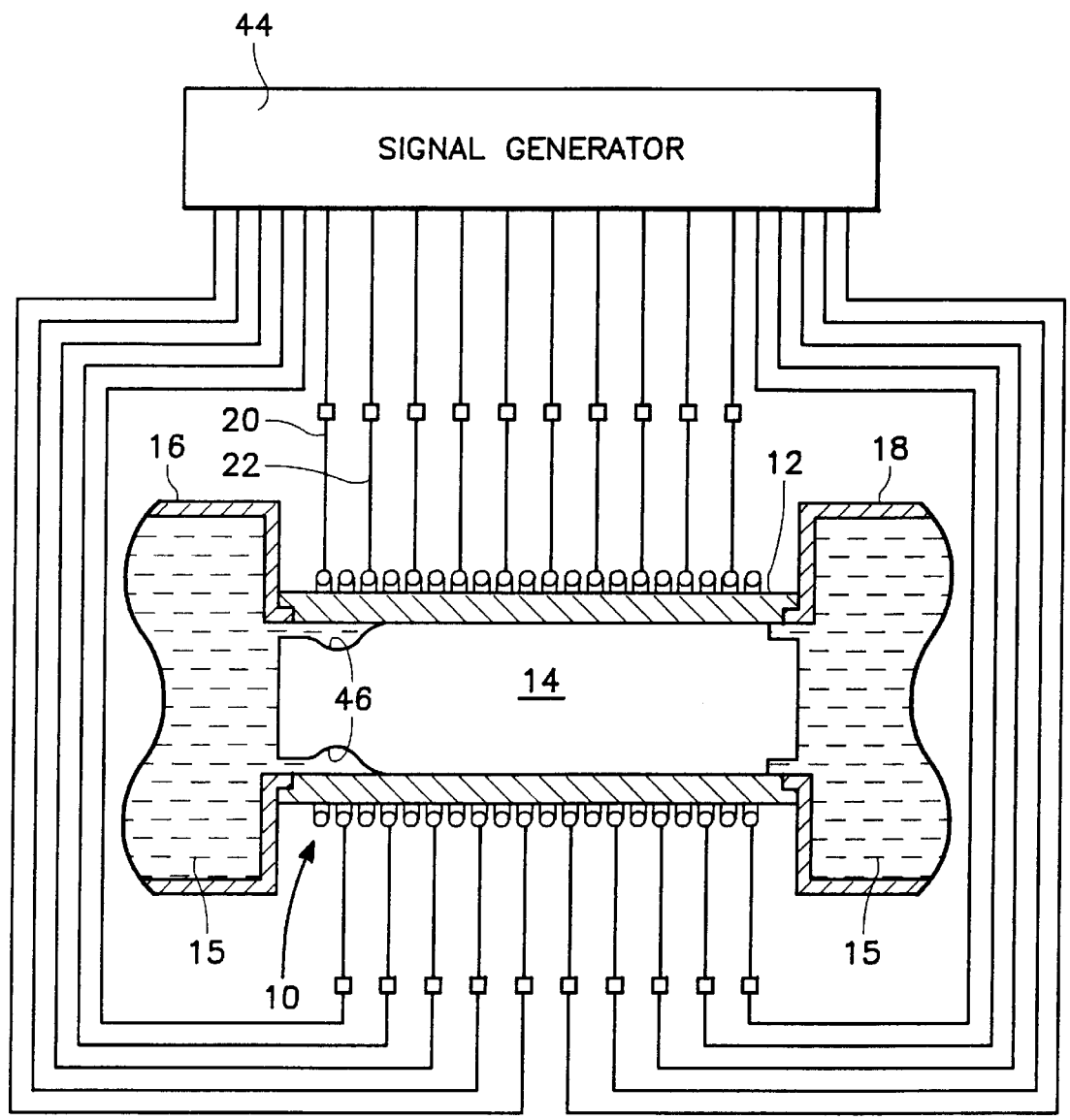
FIGS. 2–5 are cross sectional views illustrating the pump of FIG. 1 transferring a fluid from a supply chamber to a high pressure chamber.

Referring to FIGS. 1 and 2, there is wrapped around the outer surface of housing 12 are a plurality of equally spaced apart electrical coils 20, 22, 24, 26, 28, 30, 32, 34, 36 and 38. Each electrical coil 20, 22, 24, 26, 28, 30, 32, 34, 36 and 38 has a positive terminal 40 and a negative terminal 42. The positive terminal and the negative terminal of each coil 20, 22, 24, 26, 28, 30, 32, 34, 36 and 38 are connected to a signal generator 44 which generates direct current electrical signals to sequentially energize each coil.

For example, signal generator 44 will generate a first direct current electrical signal to energize coil 20, and then generate a second direct current electrical signal to energize coil 22. Signal generator 44 will next generate a third direct current electrical signal energizing coil 24 and then a direct current fourth electrical signal energizing coil 26 followed by a fifth direct current electrical signal to energize coil 28. Signal generator 44 will continue to generate direct current electrical signals sequentially energizing each coil 30, 32, 34, and 36 until the last coil 38 is energized and then de-energized.

Referring now to FIGS. 2, 3, 4 and 5, FIG. 2 illustrates a cavity 46 being formed when coil 20 is energized by signal generated 44. Energizing coil 20 creates a magnetic field. In the presence of this magnetic field, inner core section 14 expands longitudinally resulting in lateral/radial shrinkage at the left end of cylindrical shaped section where coil 20 is positioned as shown in FIG. 2. When formed in the presence of a magnetic field, cavity 46 communicates with indent 19 allowing for a transfer of fluid 15 from supply chamber 16 through indent 19 to cavity 46.

Figure 3:
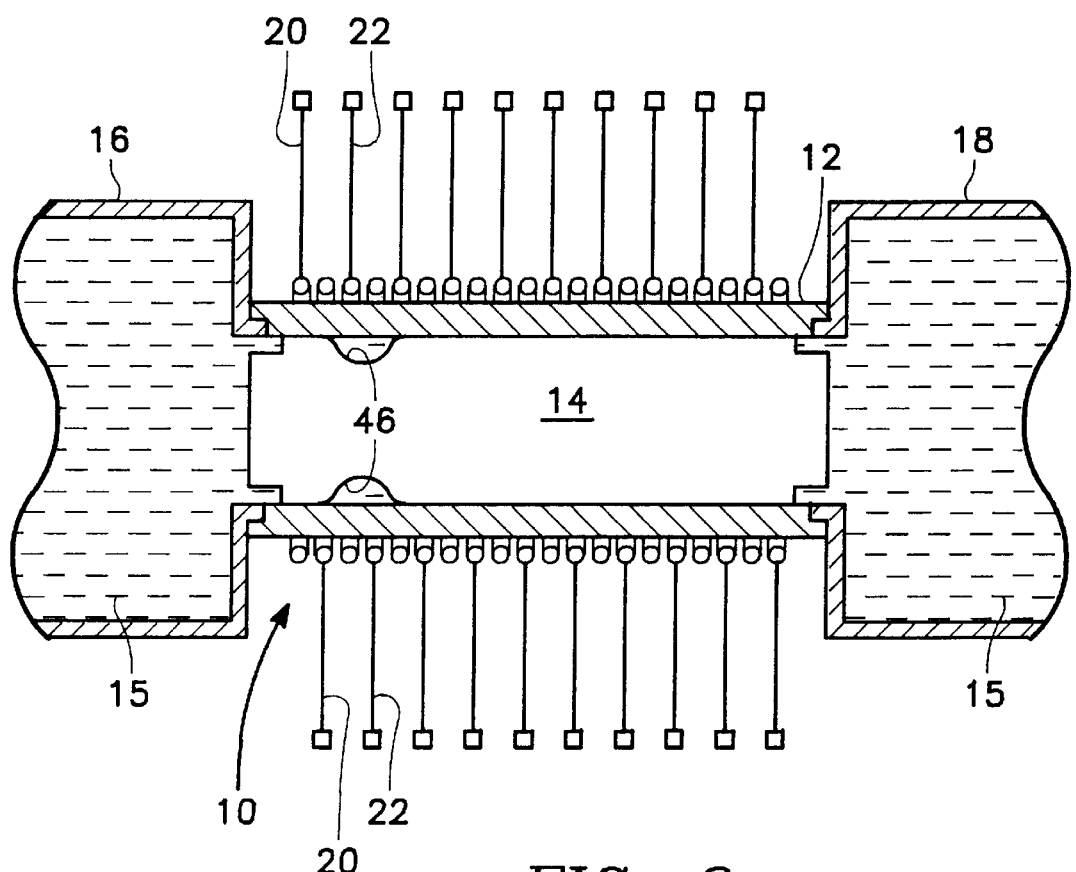

Referring to FIG. 3, when coil 22 is energized inner core section 14 will again expand longitudinally resulting in lateral/radial shrinkage in the general area of the magnetic field created by coil 22. This lateral/radial shrinkage of section 14 moves cavity 46 and the fluid contained therein to the right toward of receiving chamber 18.

Referring to FIGS. 1, 2 and 4, sequentially energizing coils 24, 26, 28, 30, 32 and 34 causes longitudinal movement of cavity 46 and fluid 15 in the direction indicated by arrow 48. Energizing coil 36 causes lateral/radial shrinkage in the general area of the magnetic field created by coil 36 resulting in movement cavity 46 and its fluid to the position depicted in FIG. 4 which is near the right end of section 14.

Figure 5:
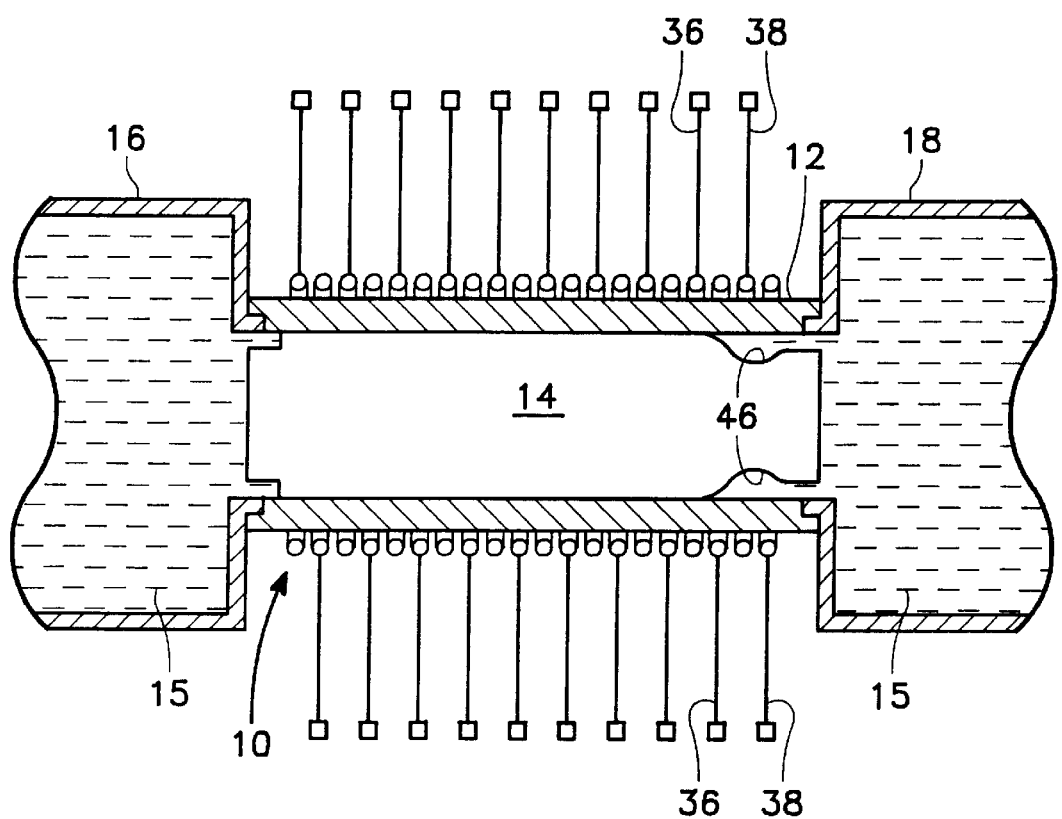

Referring to FIGS. 1, 2 and 5, energizing coil 38 results in lateral/radial shrinkage in the general area of the magnetic field created by coil 38 which is at the right end of section 14. As shown in FIG. 5, cavity 46 now communicates with receiving chamber 18 which allows for the transfer of fluid 15 from cavity 46 through indent 39 to receiving chamber 18.

Referring to FIGS. 4 and 5, an energized coil is not de-energized by signal generator 44 until its adjacent coil is sufficiently energized to create a magnetic field. Thus, for example, coil 36 will remain energized by having direct current pass through coil 36 until coil 38 creates its magnetic field. Signal generator 44 then cuts off the flow of current to coil 36 de-energizing coil 36. This allows for an efficient fluid transfer from the location depicted in FIG. 4 to the location depicted in FIG. 5. The time period during coil 36 remains energized while coil 38 is generated its magnetic field may vary from less than one second to several minutes (e.g. one minute to twenty minutes). Factors effecting this time period include the size of pump 10, the fluid 15 being transferred by pump 10 and the desired flow rate for the fluid 15 being transferred from supply chamber 16 to receiving chamber 18.

The desired flow rate of fluid between supply chamber 16 and receiving chamber 18 will have a significant impact on the physical size of pump 10 and the frequency at which signal generator 44 operates. When the flow rate is to be minimal (e.g. less than one fluid oz per minute), the frequency at which signal generator 44 generates the direct current electrical signals to sequentially energize coils 20, 22, 24, 26, 28, 30, 32, 34, 36 and 38 may be only a few cycles per second (e.g. one to twenty cycles per second). When, however, the flow rate is to be significant (e.g. ten to one thousand gallons per minute), the frequency at which signal generator 44 generates the direct current electrical signals to sequentially energize coils 20, 22, 24, 26, 28, 30, 32, 34, 36 and 38 may be several hundred cycles per second (e.g. one hundred to one thousand cycles per second).

From the foregoing, it may readily be seen that the present invention comprises a new, unique and exceedingly magnetostrictive peristaltic pump for transferring a liquid from a supply chamber to a high pressure chamber which constitutes a considerable improvement over the known prior art. Many modifications and variations of the present invention are possible in light of the above teachings. It is to be understood that within the scope of the appended claims the invention may be practiced otherwise than as specifically described.

What is claimed is:

1. A magnetostrictive peristaltic pump for transferring a liquid from a supply chamber to a receiving chamber comprising:

a housing coupled to said supply chamber and said receiving chamber, said housing having an inner surface and an outer surface;

a core section mounted in said housing, said core section having an outer surface which is flush with the inner surface of said housing to form a seal between the outer surface of said core section and the inner surface of said housing;

said core section comprising a magnetostrictive material which extends the length of said housing to communicate with said supply chamber and said receiving chamber;

a plurality of equally spaced apart electrical coils wrapped around the outer surface of said housing from one end of said housing to the other end of said housing;

signal generator means for producing a plurality of electrical signals and sequentially providing one of said electrical signals to each of said plurality of electrical coils, said plurality of electrical coils being sequentially energized by said electrical signals to form a moving cavity within said core section, said moving cavity being formed adjacent the inner wall of said housing; and said moving cavity, responsive to said electrical coils being sequentially energized by said electrical signals, traveling longitudinally from said supply chamber to said receiving chamber to extract said fluid from said supply chamber and supply said fluid to said receiving chamber.

2. The magnetostrictive peristaltic pump of claim 1 wherein said housing is fabricated from stainless steel.

3. The magnetostrictive peristaltic pump of claim 1 wherein said magnetostrictive material comprises Terfenol-D which is an alloy of the form $Tb[x]Dy[1-x]Fe_2$ where x=0.3.

4. The magnetostrictive peristaltic pump of claim 1 wherein said plurality of equally spaced apart electrical coils comprises ten equally spaced apart electrical coils.

5. The magnetostrictive peristaltic pump of claim 1 wherein said core section has first and second indents, said first indent being located at one end of said core section contiguous with said supply chamber, said second indent being located at the other end of said core section contiguous with said receiving chamber.

6. A magnetostrictive peristaltic pump for transferring a liquid from a supply chamber to a receiving chamber comprising:

a cylindrical housing coupled to said supply chamber and said receiving chamber, said cylindrical housing having an inner surface and an outer surface;

a tubular shaped core section mounted in said cylindrical housing, said tubular shaped core section having an outer surface which is flush with the inner surface of said cylindrical housing to form a seal between the outer surface of said tubular shaped core section and the inner surface of said cylindrical housing;

said tubular shaped core section comprising a magnetostrictive material which extends the length of said cylindrical housing to communicate with said supply chamber and said receiving chamber;

a plurality of equally spaced apart electrical coils wrapped around the outer surface of said cylindrical housing from one end of said cylindrical housing to the other end of said cylindrical housing;

each of said plurality of electrical coils having a positive terminal and a negative terminal; and a signal generator connected the positive terminal and the negative terminal of each of said plurality of electrical coils;

said signal generator producing a plurality of electrical signals and sequentially providing one of said electrical signals to each of said plurality of electrical coils;

said plurality of electrical coils being sequentially energized by said electrical signals to form a moving cavity within said tubular shaped core section, said moving cavity being formed adjacent the inner wall of said cylindrical housing; and said moving cavity, responsive to said electrical coils being sequentially energized by said electrical signals, traveling longitudinally from said supply chamber to said receiving chamber to extract said fluid from said supply chamber and supply said fluid to said receiving chamber.

7. The magnetostrictive peristaltic pump of claim 6 wherein said cylindrical housing is fabricated from stainless steel.

8. The magnetostrictive peristaltic pump of claim 6 wherein said magnetostrictive material comprises Terfenol-D which is an alloy of the form $Tb[x]Dy[1-x]Fe_2$ where x=0.3.

9. The magnetostrictive peristaltic pump of claim 6 wherein said plurality of equally spaced apart electrical coils comprises ten equally spaced apart electrical coils.

10. The magnetostrictive peristaltic pump of claim 6 wherein said tubular shaped core section has first and second indents, said first indent being located at one end of said tubular shaped core section contiguous with said supply chamber, said second indent being located at the other end of said tubular shaped core section contiguous with said receiving chamber.

11. A magnetostrictive peristaltic pump for transferring a liquid from a supply chamber to a receiving chamber comprising:

a cylindrical housing coupled to said supply chamber and said receiving chamber, said cylindrical housing having an inner surface and an outer surface, said cylindrical housing being fabricated from stainless steel;

a tubular shaped core section mounted in said cylindrical housing, said tubular shaped core section having an outer surface which is flush with the inner surface of said cylindrical housing to form a seal between the outer surface of said tubular shaped core section and the inner surface of said cylindrical housing;

said tubular shaped core section comprising a magnetostrictive material which extends the length of said cylindrical housing to communicate with said supply chamber and said receiving chamber;

said magnetostrictive material consisting of Terfenol-D which is an alloy of the form $Tb[x]Dy[1-x]Fe_2$ where x=0.3;

a plurality of equally spaced apart electrical coils wrapped around the outer surface of said cylindrical housing from one end of said cylindrical housing to the other end of said cylindrical housing;

each of said plurality of electrical coils having a positive terminal and a negative terminal; and a signal generator connected the positive terminal and the negative terminal of each of said plurality of electrical coils;

said signal generator producing a plurality of electrical signals and sequentially providing one of said electrical signals to each of said plurality of electrical coils;

said plurality of electrical coils being sequentially energized by said electrical signals to form a moving cavity within said tubular shaped core section, said moving cavity being formed adjacent the inner wall of said cylindrical housing; and said moving cavity, responsive to said electrical coils being sequentially energized by said electrical signals, traveling longitudinally from said supply chamber to said receiving chamber to extract said fluid from said supply chamber and supply said fluid to said receiving chamber.

12. The magnetostrictive peristaltic pump of claim 11 wherein said plurality of equally spaced apart electrical coils comprises ten equally spaced apart electrical coils.

13. The magnetostrictive peristaltic pump of claim 11 wherein said tubular shaped core section has first and second indents, said first indent being located at one end of said tubular shaped core section contiguous with said supply chamber, said second indent being located at the other end of said tubular shaped core section contiguous with said receiving chamber.

* * * * *